(12) United States Patent
Rehm et al.

(10) Patent No.: US 6,856,560 B2
(45) Date of Patent: Feb. 15, 2005

(54) REDUNDANCY IN SERIES GROUPED MEMORY ARCHITECTURE

(75) Inventors: Norbert Rehm, Yokohama (JP);
Hans-Oliver Joachim, Zushi (JP);
Thomas Roehr, Yokohama (JP); Joerg W. Wohlfahrt, Yokohama (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 156 days.

(21) Appl. No.: 10/133,764

(22) Filed: Apr. 26, 2002

(65) Prior Publication Data

US 2003/0202386 A1 Oct. 30, 2003

(51) Int. Cl.$^7$ .............................................. G11C 7/00
(52) U.S. Cl. ........................................ 365/200; 365/145
(58) Field of Search .............................. 365/200, 145, 365/63, 185.09

(56) References Cited

U.S. PATENT DOCUMENTS

| | | | | |
|---|---|---|---|---|
| 5,278,794 | A | | 1/1994 | Tanaka et al. ............... 365/200 |
| 5,898,615 | A | | 4/1999 | Chida ..................... 365/185.17 |
| 5,903,492 | A | * | 5/1999 | Takashima ................... 365/145 |
| 6,317,355 | B1 | | 11/2001 | Kang ......................... 365/145 |
| 6,493,251 | B2 | * | 12/2002 | Hoya et al. .................. 365/145 |
| 6,496,428 | B2 | * | 12/2002 | Ohno et al. .................. 365/200 |
| 6,525,974 | B2 | * | 2/2003 | Neuhold et al. ............. 365/200 |

* cited by examiner

*Primary Examiner*—Tan T. Nguyen
(74) *Attorney, Agent, or Firm*—Horizon IP Pte Ltd

(57) ABSTRACT

An improved redundancy scheme for chained memory architecture is disclosed. The redundancy scheme comprises including redundant cells as part of the memory chain. As such, a redundant cell is used to repair a defective cell within the chain. This eliminates the need in conventional chained architecture to replace the whole memory block when there is a defective cell.

25 Claims, 2 Drawing Sheets

REDUNDANCY IN SERIES GROUPED MEMORY ARCHITECTURE

FIELD OF THE INVENTION

The present invention relates to memory integrated circuits (ICs). More particularly, the invention relates to implementation of redundancy in a chained memory architecture.

BACKGROUND OF THE INVENTION

Ferroelectric metal oxide ceramic materials such as lead zirconate titanate (PZT) have been investigated for use in ferroelectric semiconductor memory devices. Other ferroelectric materials, for example, strontium bismuth tantalum (SBT) can also be used. The ferroelectric material is located between two electrodes to form a ferroelectric capacitor for storage of information. A ferroelectric capacitor uses the hysteresis polarization characteristic of the ferroelectric material for storing information. The logic value stored in the memory cell depends on the polarization direction of the ferroelectric capacitor. To change the polarization direction of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

FIG. 1 shows a pair of bitlines (bitline BL and bitline complement /BL). Each of the bitlines includes a group of memory cells (110a or 110b). The memory cells 140 of a group, each with a transistor 142 coupled to a capacitor 144 in parallel, are coupled in series to form a chain. Such a memory architecture is described in, for example, Takashima et al., "High Density Chain ferroelectric random access Memory (chain FRAM)", IEEE Jrnl. of Solid State Circuits, vol.33, pp.787–792, May 1998, which is herein incorporated by reference for all purposes. A sense amplifier "not shown" is coupled to the bitlines to facilitate access to the memory cell.

The gates of the cell transistors can be gate conductors which are coupled to or serve as wordlines. A selection transistor 130 is provided to selectively couple one end of the chain to its respective bitline (e.g., 130a couples chain 110a to BL and 130b couples chain 110b to /BL). A plateline is coupled to the other end of the chain (e.g., PL or /PL). Numerous bitline pairs or columns are interconnected via wordlines to form a memory block.

Redundant memory elements can be provided to repair defective cells. One type of redundancy scheme is referred to as row or wordline redundancy. In row redundancy, the wordline corresponding to the defective cell is replaced with a redundant row of cells via redundancy circuitry. Redundancy schemes allow some defective ICs to be repaired, thus increasing yield which reduces manufacturing costs.

However, in a chained architecture, the wordlines of a block are interdependent. Due to this interdependence, a redundant element or unit has to be the same size as the block. This means that repairing a defective cell in a block requires replacement of the whole block. Since the redundant element is the same size as the block, it can repair any number of defects within the block. With respect to defects in other blocks, one additional redundant block needs to be provided for each block to be repaired. Thus, conventional redundancy schemes in chained architecture are very inefficient and utilize significant chip area. Additionally, the relatively large number of cells in a redundant element increases the probability of a failure in the redundant element itself.

From the foregoing discussion, it is desirable to provide an improved redundancy in ICs with chained architecture.

SUMMARY OF THE INVENTION

The invention relates to improved redundancy schemes in chained memory architectures. In one embodiment, a memory chain includes x number of first memory cells, where x is equal to or greater than 2 and m second memory cells, where m is equal to or greater than 1. The first memory cells are used for storage of information and the second memory cells are used to repair defective first memory cells. By integrating redundant cells as part of the memory chain having normal storage cells, repairing a defective cell in a memory chain does not require replacement of the whole memory block in which the defective cell is located, as necessary in conventional memory chain architectures.

DETAILED DESCRIPTION OF THE INVENTION

Figure 1:
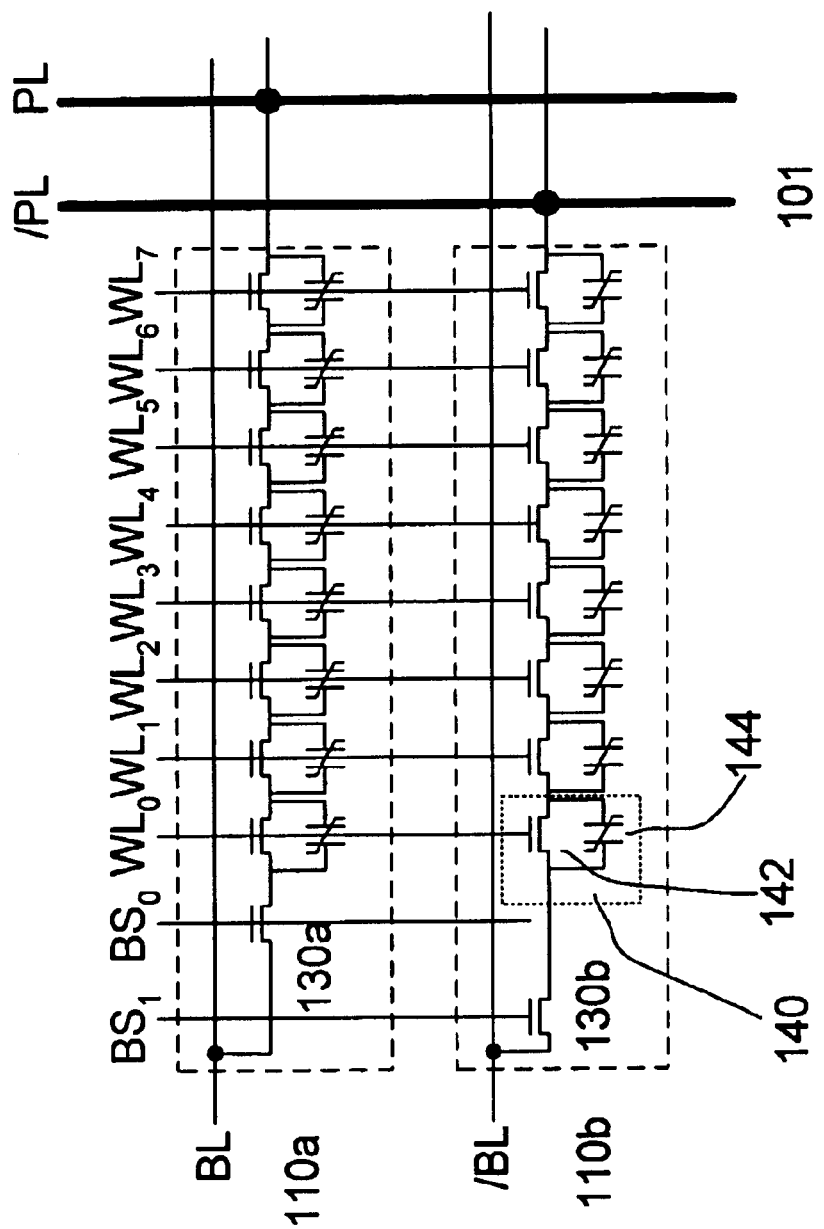
FIG. 1 shows the column of memory cells arranged in a conventional chained architecture.
Figure 2:
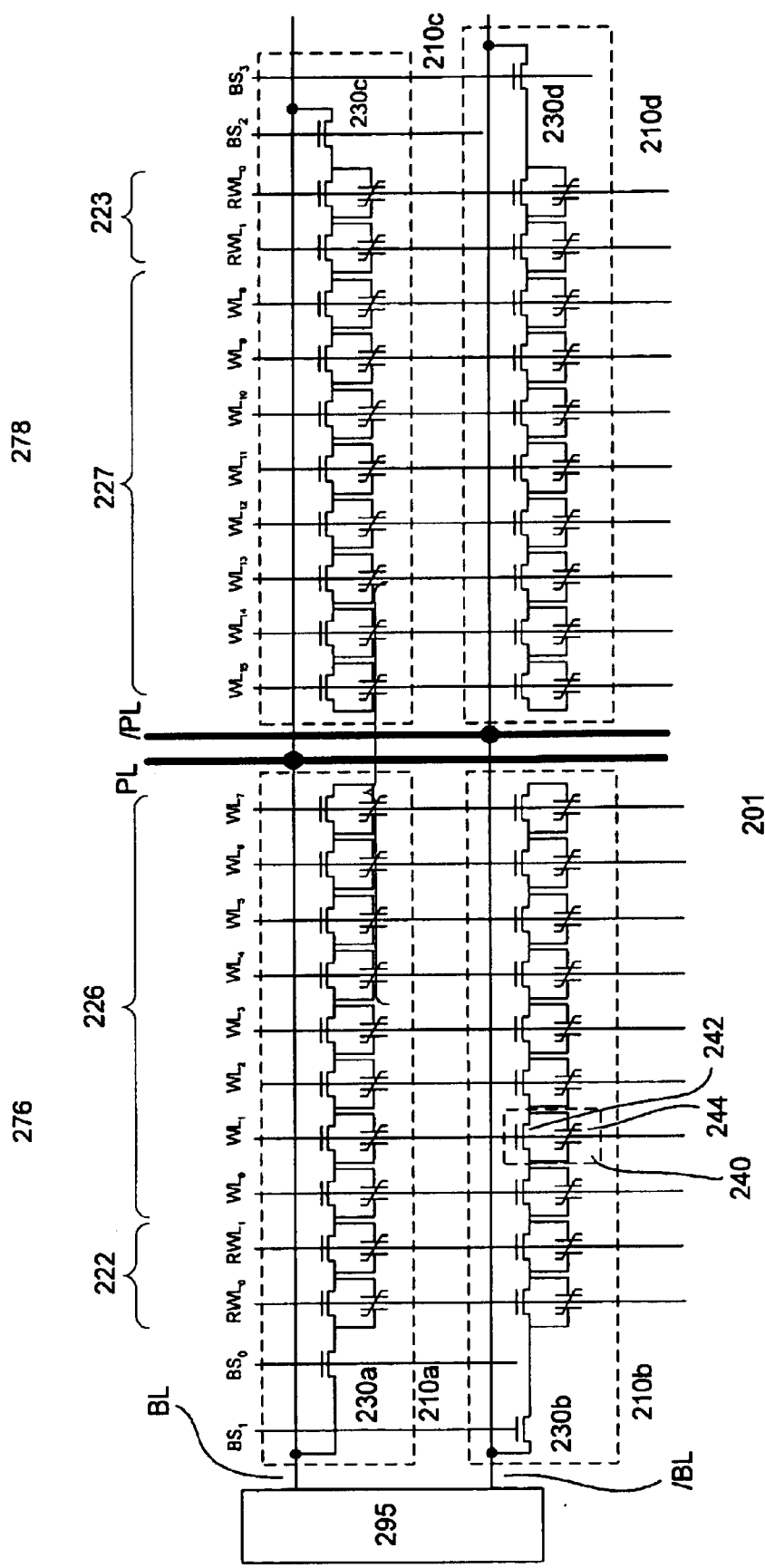
FIG. 2 shows a column of memory cells in accordance with one embodiment of the invention.

FIG. 2 shows a portion 201 of an IC with redundancy in accordance with one embodiment of the invention. A pair of bitlines (BL and /BL) which represents a column is shown. A plurality of columns are interconnected by wordlines to form a memory block or array. A sense amplifier 295 is coupled to one end of the bitlines. The bitlines each includes a memory chain (210a or 210b). The memory cells 240 of a chain, each with a transistor 242 coupled to a capacitor 244 in parallel, are coupled in series. The memory chain comprises X number of cells 226, where X is a whole number. For practical reasons, X is at least 2. Illustratively, a chain comprises 8 memory cells. Memory chains of other sizes are also useful. Preferably, the memory chain comprises $2^y$ memory cells, where y is $\geq 1$. The gates of the cell transistors can be gate conductors which are coupled to or serve as wordlines. The memory cells are addressed by wordlines $WL_0$–$WL_{x-1}$.

A selection transistor 230 is provided to selectively couple one end of the chain to its respective bitline (e.g., 230a couples chain 210a to BL and 230b couples chain 210b to /BL). Selection transistor 230a is controlled by control signal $BS_0$ and selection transistor 230b is controlled by control signal $BS_1$. If chain 210a is selected, control signal $BS_0$ is activated to couple it to the BL. On the other hand, control signal $BS_1$ is activated if chain 210b is selected. A plateline is coupled to the other end of the chain (e.g., PL or /PL). In one embodiment, the chain on BL is coupled to PL; the chain on /BL is coupled to /PL. Numerous bitline pairs are interconnected via wordlines to form a memory block.

In accordance with one embodiment of the invention, a memory chain includes R number of redundant cells 222, where R is a whole number $\geq 1$. Repairability of the block is directly related to R (i.e., the higher R is, the higher the repairability). Illustratively, the chain includes 2 redundant cells (i.e., R=2). When providing redundant cells within the chain (i.e., intra-chain redundancy), the number of cells within the chain is equal X+R. The redundant cells are addressed via redundant wordlines $RWL_0$–$RWL_{R-1}$. In one embodiment, the redundant memory cells are located at the first end of the chain, between the memory cells of the chain and selection transistor. Locating the redundant cells in other parts of the chain is also useful. It is further understood that the redundant cells need not necessarily be adjacent to each other (i.e., grouped together).

If a defective cell occurs on one of the wordlines of the chain, a redundant wordline can be used to replace the defective one. This also holds true for any number of defects in the block along the same wordline. If additional defects occur on other wordlines, other redundant wordlines can be used to replace those defective ones, so long as there are sufficient number of redundant wordlines available. For a memory chain with 8 cells, only four fuses are needed (3 bits for addressing and 1 bit to serve as a master fuse to indicate redundancy) to effect redundancy for each redundant wordline.

Memory chains 210c–d can also be provided on the bitline pairs on the other side of the platelines, forming left and right sections 276 and 278. Selection transistors on the right section, in one embodiment, are controlled by separate control signals. For example, selection transistor 230c is controlled by $BS_2$ signal and selection transistor 230d is controlled by $BS_3$. Depending on which section and which chain is selected, the appropriate control signal is activated to connect the selected chain to the bitline. In one embodiment, the cells 227 on the right side of the block are addressed by different wordlines (e.g., $WL_8$–$WL_{15}$). Like the chains on the left section, redundant cells 223 are provided. As shown, the chains are provided with 2 redundant cells. However, it is not necessary that the chains on the right section have the same number of redundant and memory cells as the left section.

As described, intra-chain redundancy in accordance with the invention enables more efficient use of redundant elements, compared to conventional approaches. For example, a defective wordline can be replaced with a redundant wordline instead of a whole block. Furthermore, since fewer cells are used, the redundancy element has a lower probability of failure. Also, chain size is also more flexible.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   x first memory cells, where x is greater than or equal to 2, the first memory cells serve as storage memory cells;
   m second memory cells, where m is equal to or greater than 1, the second memory cells serve as redundant memory cells, wherein a second memory cell is used to repair a defective first memory cell; and
   the first and second memory cells, each comprises a transistor coupled to a capacitor in parallel, are coupled in series to form a group, wherein providing the second memory cells within a same group as the first memory cells enables replacement of the defective first memory cell without the need for block replacement.

2. The integrated circuit of claim 1 wherein the memory cells are ferroelectric memory cells.

3. The integrated circuit of claim 2 where x is equal $2^t$ and t is equal to or greater than 1.

4. The integrated circuit of claim 1 where x is equal $2^t$ and t is equal to or greater than 1.

5. The integrated circuit of claim 1, 2, 3, or 4 wherein a first end of the group is coupled to a bitline and a second end is coupled to a plateline.

6. The integrated circuit of claim 5 wherein the first end of the group is coupled to the bitline via a selection transistor.

7. The integrated circuit of claim 6 further comprises:
   a second memory group having a first end coupled to a second bitline via a second selection transistor and a second end coupled to a second plateline, the second memory group includes x first memory cells and m second memory cells, the bitline and second bitline forming a bitline pair; and
   first and second control signal for controlling the first and second selection transistors.

8. The integrated circuit 7 further comprises a plurality of the bitline pairs to form a memory block.

9. The integrated circuit of claim 7 further comprises:
   a third memory group having a first end coupled to the bitline via a third selection transistor and a second end coupled to the plateline;
   a fourth memory group having a first end coupled to the second bitline via a fourth selection transistor and a second end coupled to the second plateline, the third and fourth memory groups each comprises y first memory cells, where y is equal to or greater than 1, and n second memory cells, and n is equal to or greater than 1.

10. The integrated circuit 9 further comprises a plurality of the bitline pairs to form a memory block.

11. The integrated circuit of claim 9 further comprises third and fourth control signals for controlling the third and fourth selection transistors.

12. The integrated circuit 11 further comprises a plurality of the bitline pairs to form a memory block.

13. The integrated circuit of claim 9 wherein n=m and y=x.

14. The integrated circuit of claim 13 further comprises third and fourth control signals for controlling the third and fourth selection transistors.

15. The integrated circuit 14 further comprises a plurality of the bitline pairs to form a memory block.

16. The integrated circuit of claim 5 further comprises a second memory group having a first end coupled to a second bitline and a second end coupled to a second plateline, the second memory group includes x first memory cells and m second memory cells, the bitline and second bitline forming a bitline pair.

17. The integrated circuit 16 further comprises a plurality of the bitline pairs to form a memory block.

18. The integrated circuit of claim 16 further comprises:
   a third memory group having a first end coupled to the bitline and a second end coupled to the plateline;
   a fourth memory group having a first end coupled to the second bitline and a second end coupled to the second plateline, the third and fourth memory groups each comprises y first memory cells, where y is equal to or greater than 1, and n second memory cells, and n is equal to or greater than 1.

19. The integrated circuit of claim 18 wherein n=m and y=x.

20. The integrated circuit of claim 19 further comprises a plurality of the bitline pairs to form a memory block.

21. A method of redundancy in a memory array comprising:
   providing first memory cells for storing data;

providing second memory cells, the second memory cells serving as redundant cells;

coupling the first and second memory cells in series to form a group; and in the event one of the first memory cells is defective, replacing the first defective memory cell with one of the second memory cells, wherein providing both first and second memory cells in a same group enables replacement of a defective first memory cell without the need for block replacement.

22. The method of claim 21 wherein the memory cells are ferroelectric memory cells.

23. The method of claim 22 where x is equal $2^t$ and t is equal to or greater than 1.

24. The method of claim 21 where x is equal $2^t$ and t is equal to or greater than 1.

25. The method of claim 21, 22, 23 or 24 further comprises providing a second memory group having a first end coupled to a second bitline, the second memory group includes x first memory cells and m second memory cells, the bitline and second bitline forming a bitline pair.

* * * * *